United States Patent
Kim et al.

(10) Patent No.: US 7,927,988 B2
(45) Date of Patent: Apr. 19, 2011

(54) METHOD OF FABRICATING SEMICONDUCTOR DEVICE

(75) Inventors: In-Gyoo Kim, Daejeon (KR); O-Kyun Kwon, Daejeon (KR); Dong-Woo Suh, Daejeon (KR); Gyung-Ock Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 2 days.

(21) Appl. No.: 12/488,577

(22) Filed: Jun. 21, 2009

(65) Prior Publication Data

US 2010/0159674 A1 Jun. 24, 2010

(30) Foreign Application Priority Data

Dec. 22, 2008 (KR) .................. 10-2008-0131060

(51) Int. Cl.
*H01L 21/425* (2006.01)

(52) U.S. Cl. ........ 438/514; 438/680; 438/770; 438/506; 257/E21.17; 257/E21.043; 257/E21.077; 257/E21.226; 257/E21.229; 257/E21.278; 257/E21.32; 257/E21.324

(58) Field of Classification Search .................. 438/506, 438/514, 199, 311, 623, 680, 684, 706, 740, 438/745, 723, 743, 756, 770; 257/E21.17, 257/43, 77, 226, 229, 278, 32, 324
See application file for complete search history.

(56) References Cited

U.S. PATENT DOCUMENTS

| 1,745,175 | A | | 1/1930 | Lilienfeld | |
|---|---|---|---|---|---|
| 5,130,271 | A | * | 7/1992 | Migita | 438/527 |
| 5,637,524 | A | * | 6/1997 | Lee et al. | 438/448 |
| 5,994,200 | A | * | 11/1999 | Kim | 438/425 |
| 6,495,424 | B2 | * | 12/2002 | Kunikiyo | 438/296 |
| 7,247,890 | B2 | * | 7/2007 | Sekiguchi et al. | 257/192 |
| 2008/0044669 | A1 | | 2/2008 | Adachi | |

FOREIGN PATENT DOCUMENTS

| EP | 1986219 A1 | 10/2008 |
|---|---|---|
| KR | 0145824 B1 | 11/1998 |
| KR | 1020030090881 A | 12/2003 |
| KR | 1020050043137 A | 5/2005 |
| KR | 1020050100665 A | 10/2005 |

OTHER PUBLICATIONS

S. Nakashima et al., "Investigations on High-Temperature Thermal Oxidation Process at Top and Bottom Interfaces of Top Silicon of SIMOX Wafers," J. Electrochem. Soc., Jan. 1996, pp. 244-251, vol. 143, No. 1.

* cited by examiner

*Primary Examiner* — David Nhu

(57) ABSTRACT

Provided is a method of fabricating a semiconductor device. The method includes forming a first layer, a second layer, an ion implantation layer between the first and second layers, and an anti-oxidation layer on the second layer, and performing a heat treating process to form an insulating layer between the first and second layers while preventing loss of the second layer using the anti-oxidation layer.

15 Claims, 8 Drawing Sheets

METHOD OF FABRICATING SEMICONDUCTOR DEVICE

CROSS-REFERENCE TO RELATED APPLICATIONS

This U.S. non-provisional patent application claims priority under 35 U.S.C. §119 of Korean Patent Application No. 10-2008-0131060, filed on Dec. 22, 2008, the entire contents of which are hereby incorporated by reference.

BACKGROUND

The present invention disclosed herein relates to a method of fabricating a semiconductor device, and more particularly, to a method of forming a substrate of a semiconductor device.

As the miniaturization, high-speed and low-power-consuming of semiconductor devices are required, a method of forming devices on an insulator is widely used instead of methods of fabricating complementary metal oxide semiconductor (CMOS) devices on a bulk silicon substrate. Thus, technologies for a silicon-on-insulator (SOI) substrate are developed.

Such SOI substrates may include a bonded and etch-back SOI (BESOI), a smart-cut SOI substrate using hydrogen implantation, and a separation by implanted oxygen (SIMOX) substrate. The BESOI substrate has a low defect rate, and is adapted for making a buried oxide (BOX) layer thick. Thus, the BESOI substrate can be used in high-voltage bipolar applications and micro electro mechanical systems (MEMS) accelerometers. The SIMOX substrate is radiation hardened, and adapted for high-speed, miniaturization, and integration, and used in very large scale integrated (VLSI) CMOSs and high-speed multi-core microprocessors.

SUMMARY

The present invention provides a method of fabricating a semiconductor device having improved reliability.

Embodiments of the present invention provide methods of fabricating a semiconductor device, the methods including: forming a first layer, a second layer, an ion implantation layer between the first and second layers, and an anti-oxidation layer on the second layer; and performing a heat treating process to form an insulating layer between the first and second layers while preventing loss of the second layer using the anti-oxidation layer.

In some embodiments, the ion implantation layer may be formed by performing an ion implantation process on a semiconductor substrate, and the semiconductor substrate may be exposed through an ion implantation prevention mask. The anti-oxidation layer may be partially oxidized through the heat treating process.

In other embodiments, the anti-oxidation layer may include polysilicon or crystalline silicon. The first and second layers may include crystalline silicon, and the ion implantation layer may include oxygen ions. The methods may further include removing the anti-oxidation layer after the heat treating process.

In still other embodiments, the methods may further include forming a sacrificial layer between the second layer and the anti-oxidation layer.

In even other embodiments, the sacrificial layer may include a material having an etch selectivity to the first and second layers and the anti-oxidation layer.

In yet other embodiments, the sacrificial layer may include a silicon oxide layer formed through a low pressure chemical vapor deposition process. The anti-oxidation layer may include a polysilicon layer formed through the low pressure chemical vapor deposition process.

In further embodiments, the anti-oxidation layer may be entirely oxidized through the heat treating process, or the anti-oxidation layer may be entirely oxidized and the second layer may be partially oxidized through the heat treating process.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1A:
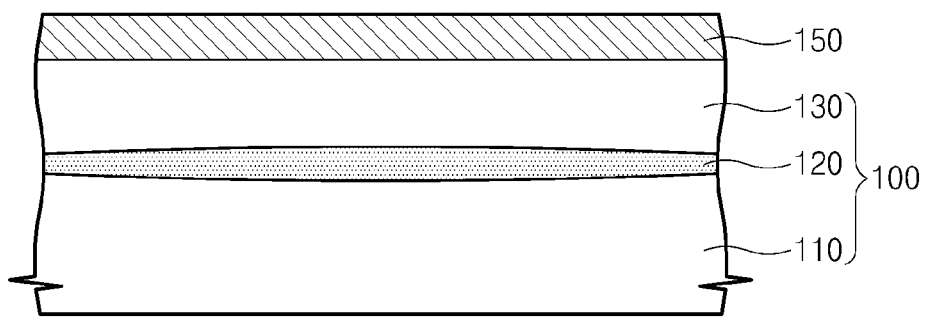
FIGS. 1A, 1B and 1C are cross-sectional views illustrating a method of fabricating a semiconductor device according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, it will be described about an exemplary embodiment of the present invention in conjunction with the accompanying drawings.

Figure 1B:
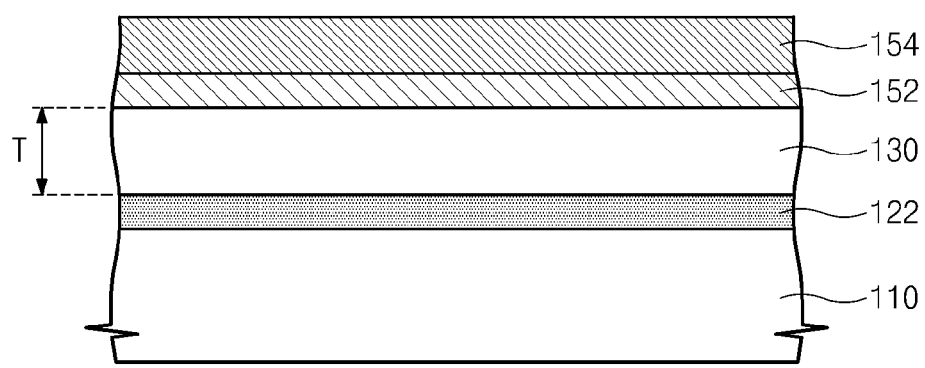
Figure 1C:
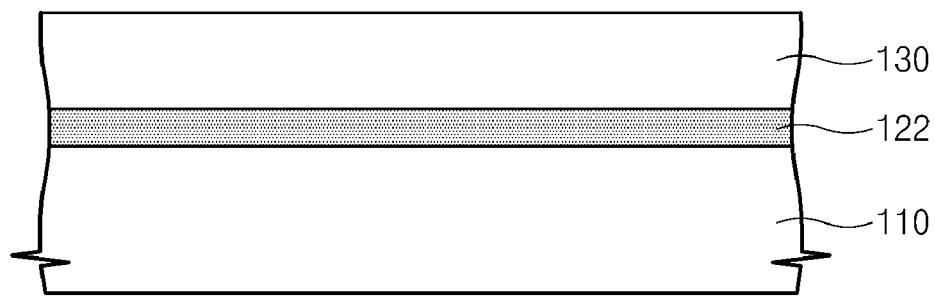

FIGS. 1A, 1B, and 1C are cross-sectional views illustrating a method of fabricating a semiconductor device according to an embodiment of the present invention.

Referring to FIG. 1A, a semiconductor substrate 100 is provided. The semiconductor substrate 100 may include crystalline silicon. The material of the semiconductor substrate 100 is not limited to the crystalline silicon. An ion implantation layer 120 is formed within the semiconductor substrate 100, so as to form a first layer 110 and a second layer 130. An ion implantation layer may be formed in the semiconductor substrate 100 exposed by an ion implantation prevention mask (not shown). The ion implantation layer 120 may include oxygen ions. For example, the oxygen ions are implanted into the semiconductor substrate 100 with a dose of about $1E^{17}/cm^2$ to about $2E^{18}/cm^2$ to form the ion implantation layer 120 between the first and second layers 110 and 130. The depth of the ion implantation layer 120 may be determined by the energy of the oxygen ions, which may be several tens through hundreds keV.

After forming the ion implantation layer 120, an anti-oxidation layer 150 may be formed on the second layer 130. The anti-oxidation layer 150 may include a layer that can be thermally oxidized. The anti-oxidation layer 150 has a thickness of about 1000 nm. For example, the anti-oxidation layer 150 may include polysilicon or crystalline silicon. The anti-oxidation layer 150 covers the second layer 130 to protect the top surface of the second layer 130 from air. Alternately, the anti-oxidation layer 150 is formed on the semiconductor substrate 100, and then the ion implantation layer 120 is formed by increasing the energy of the oxide ions.

Referring to FIG. 1B, a heat treating process is performed to convert the ion implantation layer 120 between the first and second layers 110 and 130 into an insulating layer 122. The insulating layer 122 is formed by oxygen of the ion implantation layer 120 reacting with the first and second layers 110 and 130 contacting the ion implantation layer 120, and thus the insulating layer 122 may be thicker than the ion implantation layer 120. For example, the insulating layer 122 may be a silicon oxide layer. For example, the heat treating process may be performed at a temperature ranging from about 1000° C. to about 1700° C. The heat treating process may include a high temperature heat treating process with oxidizing silicon. The heat treating process may include a high temperature heat treating process for fabricating a separation by implanted oxygen (SIMOX), a heat treating process for an internal thermal oxide (ITOX), and a heat treating process for Micro-Electro-Mechanical Systems (MEMS).

The heat treating process may oxidize the upper portion of the anti-oxidation layer 150 to form a remaining anti-oxidation layer 152 and a control oxide layer 154 on the remaining anti-oxidation layer 152. For example, the control oxide layer 154 may be a silicon oxide layer.

According to the embodiment of the present invention, the upper portion of the anti-oxidation layer 150 is oxidized to prevent the loss of the upper portion of the second layer 130, e.g., the oxidation of the upper portion of the second layer 130. Accordingly, the insulating layer 122 may be formed without reducing a thickness T of the second layer 130. The thickness T of the second layer 130 may be the distance between the top surface of the insulating layer 122 and the top surface of the second layer 130.

Referring to FIG. 1C, the control oxide layer 154 and the remaining anti-oxidation layer 152 may be removed through a removing process that may include a first removing process and a second removing process. The first removing process, which is a process of removing the control oxide layer 154, may be an anisotropy process and/or an isotropy process. The second removing process, which is a process of removing the remaining anti-oxidation layer 152, may be an anisotropy process and/or an isotropy process.

Figure 2A:
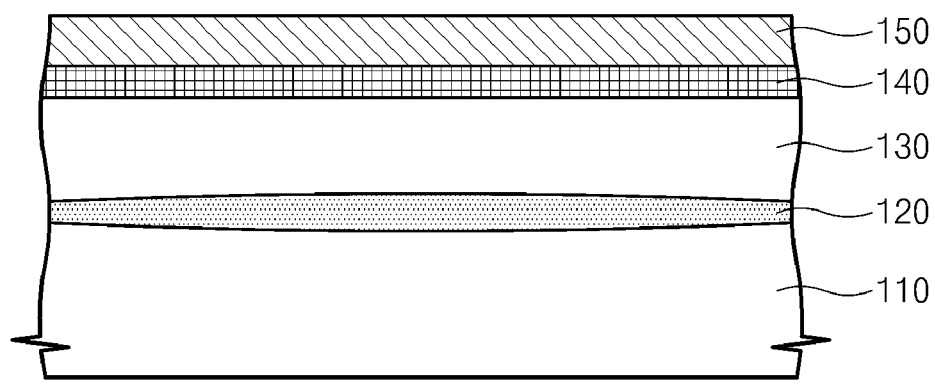
FIGS. 2A, 2B and 2C are cross-sectional views illustrating a method of fabricating a semiconductor device according to another embodiment of the present invention.
Figure 2B:
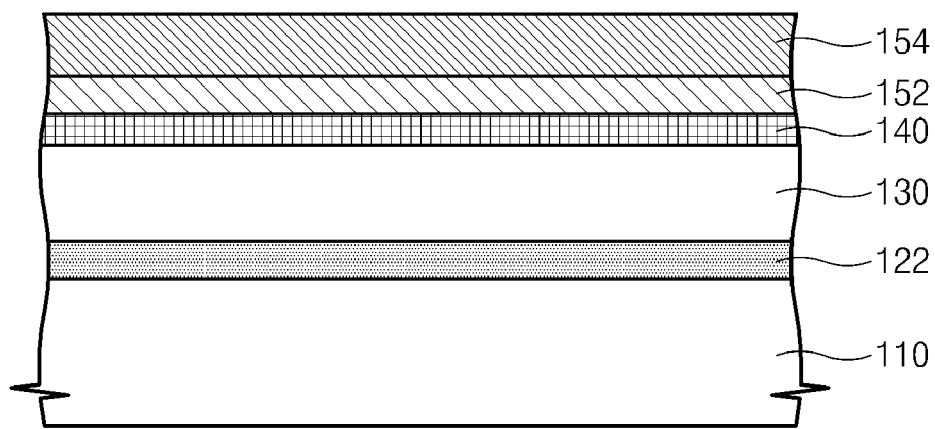
Figure 2C:
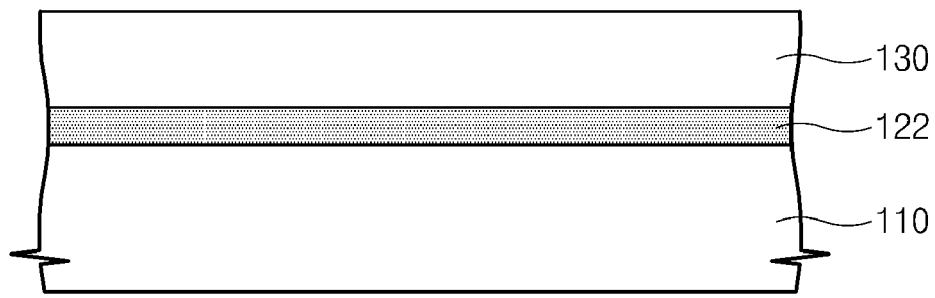

FIGS. 2A, 2B and 2C are cross-sectional views illustrating a method of fabricating a semiconductor device according to another embodiment of the present invention. This embodiment is similar with the previous embodiment, and thus, for convenience in description, the same part as that of the previous embodiment will be omitted or described in outline.

Referring to FIG. 2A, the ion implantation layer 120 is disposed within the semiconductor substrate 100 to form the first and second layers 110 and 130. The ion implantation layer 120 may include oxygen ions.

A sacrificial layer 140 and the anti-oxidation layer 150 may be sequentially formed on the second layer 130. The sacrificial layer 140 may include a material that is different from the first and second layers 110 and 130 and the anti-oxidation layer 150 in etch selectivity. For example, the sacrificial layer 140 may include a silicon oxide layer. The anti-oxidation layer 150 may include a layer that can be thermally oxidized. For example, the anti-oxidation layer 150 may include polysilicon or crystalline silicon.

In a high temperature heat treating process that will be performed subsequently, great stress may be applied to the interface between the anti-oxidation layer 150 and the sacrificial layer 140 and to the interface between the second layer 130 and the sacrificial layer 140. Thus, the anti-oxidation layer 150 and the sacrificial layer 140 each may include a material having a low deformation characteristic at a high temperature. For example, the sacrificial layer 140 may be a silicon oxide layer deposited with tetraethyl orthosilicate (Si(OC$_2$H$_5$)$_4$) according to a low pressure chemical vapor deposition (LP-CVD) process. For example, the anti-oxidation layer 150 may be a polysilicon layer formed according to the LP-CVD process.

Referring to FIG. 2B, the heat treating process is performed to convert the ion implantation layer 120 between the first and second layers 110 and 130 into the insulating layer 122.

The heat treating process may partially oxidize the anti-oxidation layer 150 on the sacrificial layer 140, so as to form the remaining anti-oxidation layer 152 and the control oxide layer 154 on the remaining anti-oxidation layer 152.

Referring to FIG. 2C, the control oxide layer 154, the remaining anti-oxidation layer 152, and the sacrificial layer 140 on the second layer 130 are removed.

For example, the control oxide layer 154 may be removed with hydrofluoric acid (HF). For example, the remaining anti-oxidation layer 152 may be removed through a dry etching process using the sacrificial layer 140 as an etch stop layer. After removing the remaining anti-oxidation layer 152, the sacrificial layer 140 may be removed through, e.g., a dry etching process or a wet etching process. In another case where the anti-oxidation layer 150 is formed in a predetermined region of the second layer 130 and the sacrificial layer 140 is formed more widely than the anti-oxidation layer 150, when the control oxide layer 154 is removed after a heat treating process, the sacrificial layer 140 may be exposed. Then, a wet etching process may be performed on the exposed sacrificial layer 140 to remove the remaining anti-oxidation layer 152 together with the sacrificial layer 140 from the second layer 130.

According to the current embodiment, the insulating layer 122 is formed without losing the upper portion of the second layer 130. In addition, since the sacrificial layer 140 is greater than the remaining anti-oxidation layer 152 and the second layer 130 in etch selectivity, the remaining anti-oxidation layer 152 is easily removed using the sacrificial layer 140 with preventing damage to the top surface of the second layer 130, thereby providing a substrate including the second layer 130 with improved reliability. As a result, the reliability of the semiconductor device is improved.

Figure 3A:
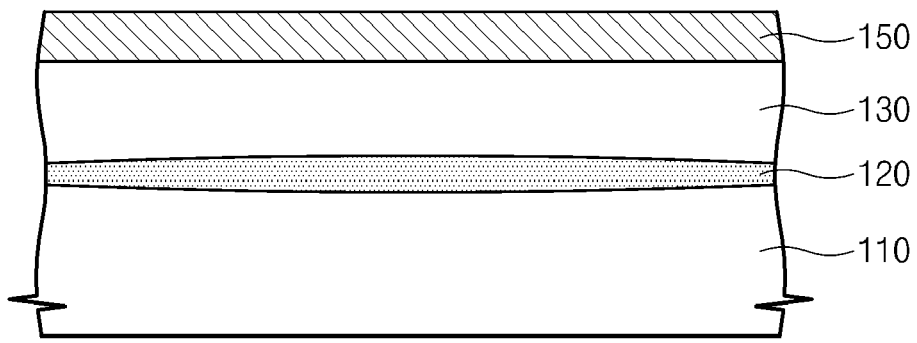
FIGS. 3A and 3B are cross-sectional views illustrating a method of fabricating a semiconductor device according to another embodiment of the present invention.
Figure 3B:
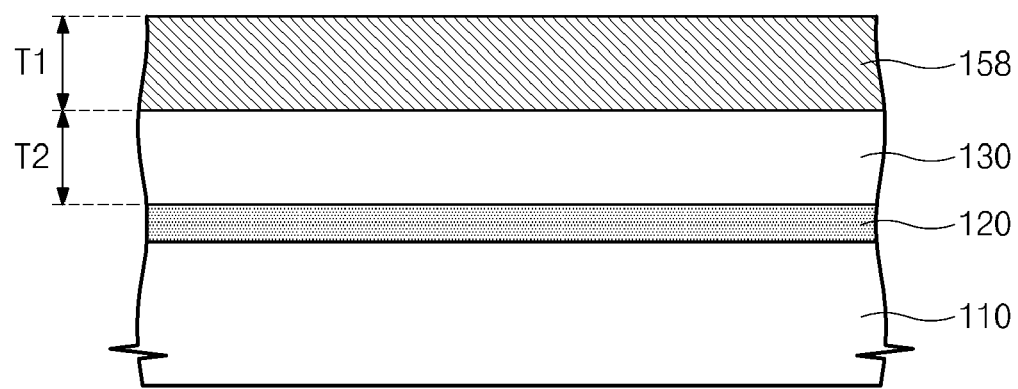

FIGS. 3A and 3B are cross-sectional views illustrating a method of fabricating a semiconductor device according to another embodiment of the present invention. This embodiment is similar with the most previous embodiment, and thus, for convenience in description, the same part as that of the most previous embodiment will be omitted or described in outline.

Referring to FIG. 3A, the first and second layers 110 and 130, the ion implantation layer 120 between the first and second layers 110 and 130, and the anti-oxidation layer 150 on the second layer 130 are formed in the manner of FIG. 1A.

Referring to FIG. 3B, a heat treating process is performed to convert the ion implantation layer 120 between the first and second layers 110 and 130 into the insulating layer 122. The heat treating process completely oxidizes the anti-oxidation layer 150 to form the control oxide layer 158. The upper portion of the second layer 130 is oxidized through the heat treating process.

According to the current embodiment, the anti-oxidation layer 150 is completely oxidized, or the anti-oxidation layer 150 is completely oxidized and the second layer 130 is partially oxidized, so as to adjust a thickness T1 of the control oxide layer 158, thereby adjusting a thickness T2 of the second layer 130.

Figure 4A:
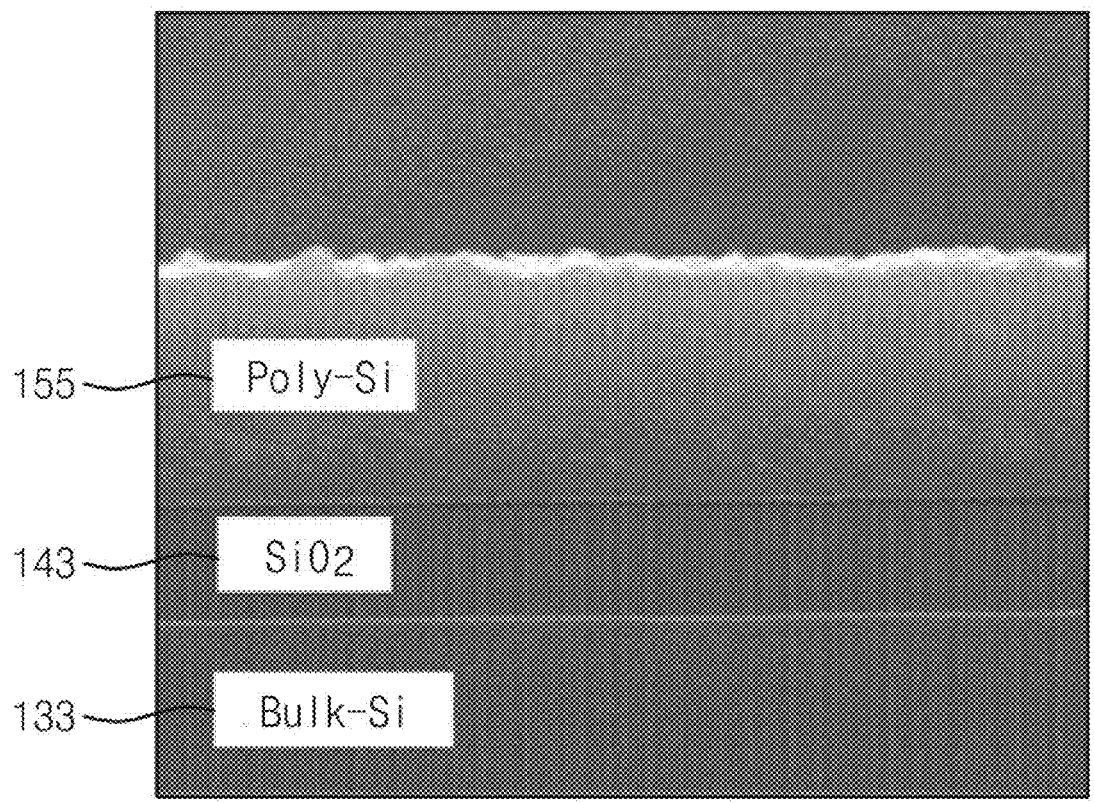
FIGS. 4A, 4B and 4C are scanning electron microscope (SEM) images of a semiconductor substrate according to the embodiment of FIGS. 2A, 2B and 2C.
Figure 4B:
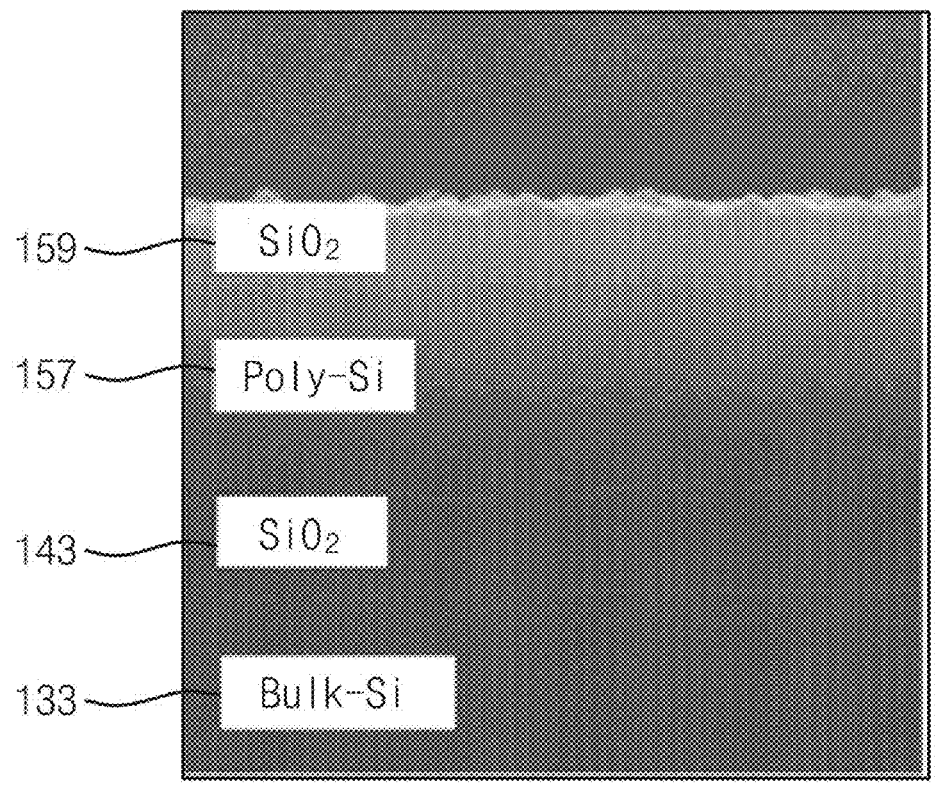
Figure 4C:
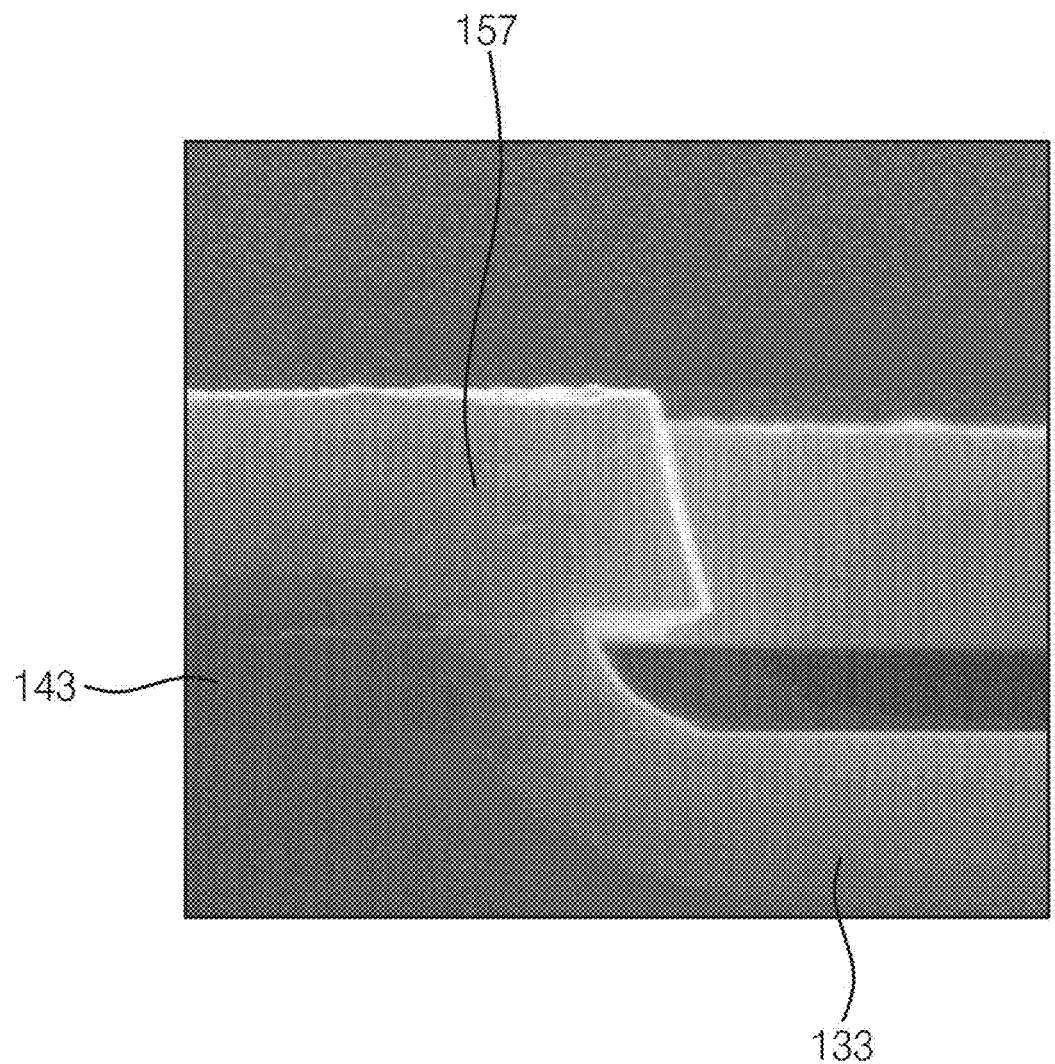

FIGS. 4A, 4B and 4C are scanning electron microscope (SEM) images of a semiconductor substrate according to the embodiment of FIGS. 2A, 2B and 2C.

Referring to FIG. 4A, a sacrificial layer 143 and an anti-oxidation layer 155 are sequentially stacked on a second layer 133. For example, the sacrificial layer 143 may be a silicon oxide layer formed according to the LP-CVD process. For example, the anti-oxidation layer 155 may be a polysilicon layer formed according to the LP-CVD process. The second layer 133 may include silicon.

Referring to FIG. 4B, a heat treating process is performed to form a remaining anti-oxidation layer 157 and a control oxide layer 159 on the sacrificial layer 143.

It will be appreciated that the control oxide layer 159 is formed on the remaining anti-oxidation layer 157 through the heat treating process without oxidizing the second layer 133. Thus, there is no variation in the thickness of the second layer 133.

Referring to FIG. 4C, the control oxide layer 159 is removed, and the remaining anti-oxidation layer 157 and the sacrificial layer 143 are partially removed, and then the top surface of the second layer 133 is exposed. The top surface of the second layer 133 is not oxidized in its original state.

Figure 5:
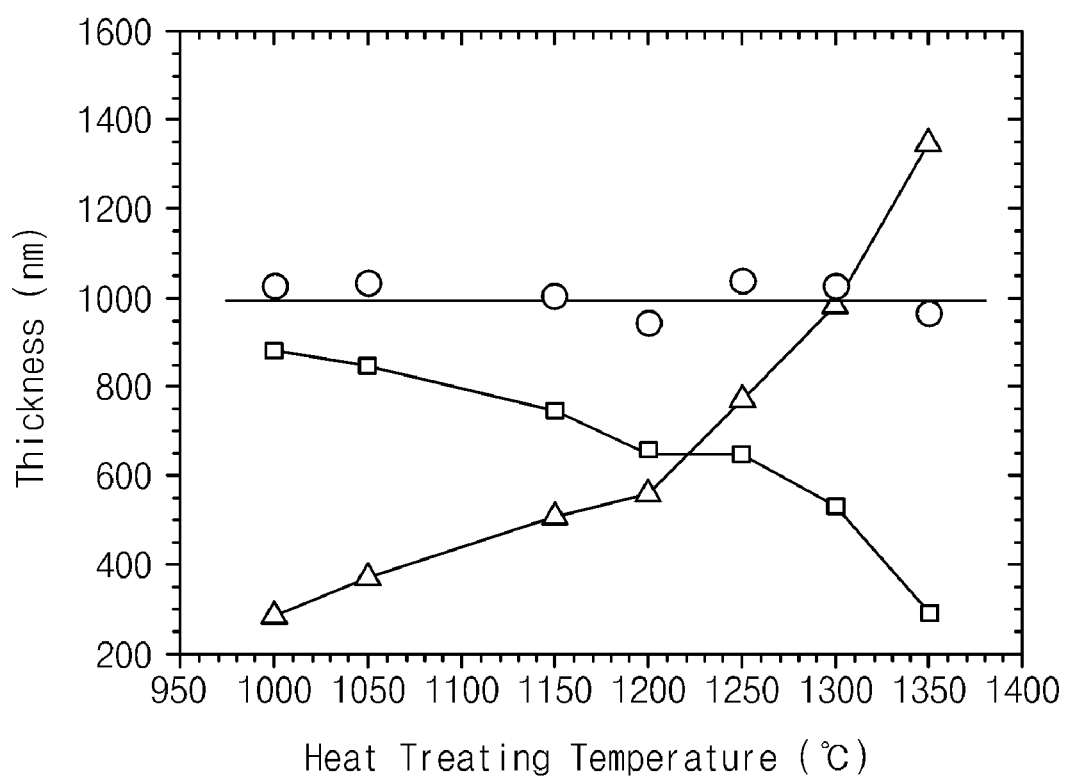
FIG. 5 is a graph illustrating thicknesses of a remaining anti-oxidation layer and a control oxide layer according to temperatures of a heat treating process in accordance with embodiments of the present invention.

FIG. 5 is a graph illustrating thicknesses of a remaining anti-oxidation layer and a control oxide layer according to temperatures of a heat treating process in accordance with embodiments of the present invention. A polysilicon layer is used as an anti-oxidation layer, and the heat treating process is performed for four hours. Triangles denote the thicknesses of the control oxide layer, and tetragons denote the thickness of the remaining anti-oxidation layer, and circles denote the sum of the thickness of the remaining anti-oxidation layer and the half of the thickness of the control oxide layer. The thickness of the anti-oxidation layer may be about 1000 nm.

Referring to FIG. 5, values of the circles are distributed near 1000 nm that is the thickness of the anti-oxidation layer. That is, it will be appreciated that the control oxide layer is about two times greater than the anti-oxidation layer in thickness. Based on data illustrated in FIG. 5, temperature and time of the heat treating process are adjusted with varying the thickness of the anti-oxidation layer, so as to control an oxidized amount of a first layer, e.g., of a substrate including silicon.

According to one embodiment of the present invention, in the substrate including the upper and lower layers and the insulating layer between the upper and lower layers, the insulating layer can be formed without reducing the thickness of the upper layer.

According to another embodiment of the present invention, the insulating layer is formed without reducing the thickness of the upper layer, and the top surface of the upper layer is protected from damage. Thus, the substrate including the upper layer has improved reliability.

According to another embodiment of the present invention, the upper layer of the substrate can be varied in thickness.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a silicon-on-insulator (SOI) substrate for a semiconductor device, the method comprising:
   providing a first substrate layer, a second substrate layer, an ion implantation layer between the first and second substrate layers;
   providing an anti-oxidation layer over the second substrate layer; and
   performing a heat treating process to convert the ion implantation layer into an insulating layer, the insulating layer being provided between the first and second substrate layers,
   wherein the anti-oxidation layer is configured to protect the second substrate layer from being oxidized during the heat treating process.

2. The method of claim 1, wherein the ion implantation layer is provided between the first and second substrate layers by performing an ion implantation process on a semiconductor substrate,
   the semiconductor substrate being exposed through an ion implantation prevention mask.

3. The method of claim 1, wherein the anti-oxidation layer is partially oxidized through the heat treating process.

4. The method of claim 1, wherein the anti-oxidation layer comprises polysilicon or crystalline silicon, or both.

5. The method of claim 1, wherein the first and second substrate layers each includes crystalline silicon, and the ion implantation layer comprises oxygen.

6. The method of claim 1, further comprising removing the anti-oxidation layer after the heat treating process.

7. The method of claim 1, further comprising forming a sacrificial layer between the second layer and the anti-oxidation layer.

8. The method of claim 7, wherein the sacrificial layer comprises a material having an etch selectivity to the first and second substrate layers and the anti-oxidation layer.

9. The method of claim 8, wherein the sacrificial layer comprises a silicon oxide layer formed through a low pressure chemical vapor deposition process.

10. The method of claim 8, wherein the anti-oxidation layer comprises a polysilicon layer formed through the low pressure chemical vapor deposition process.

11. A method of fabricating a semiconductor device, the method comprising:
   forming a first layer, a second layer, and an ion implantation layer between the first and second layers;

forming an anti-oxidation layer on the second layer; and thermally treating the ion implantation layer to convert at least part of the ion-implantation layer into an insulation layer, wherein the anti-oxidation layer is configured to minimize oxidation of the second layer during the thermal treatment of the ion implantation layer, wherein the anti-oxidation layer is entirely oxidized through the heat treating process, or the anti-oxidation layer is entirely oxidized and the second layer is partially oxidized through the heat treating process.

12. A method for fabricating a semiconductor device, the method comprising:

providing a substrate;

implanting ions into the substrate such that an ion implantation layer is formed to define a first semiconductor layer and a second semiconductor layer, the ion implantation layer being disposed between the first and second semiconductor layers;

forming an anti-oxidation layer on the second semiconductor layer; and thermally treating the ion implantation layer to convert at least part of the ion-implantation layer into an insulating layer, wherein the anti-oxidation layer is configured to protect the second semiconductor layer from being oxidized, wherein the first and the second semiconductor layers each includes crystalline silicon, and the ion implantation layer comprises oxygen.

13. The method of claim 12, wherein the anti-oxidation layer is formed after the ion-implantation layer.

14. The method of claim 12, wherein the anti-oxidation layer is at least substantially oxidized by the thermal treatment.

15. The method of claim 14, the second layer is partially oxidized by the thermal treatment.

* * * * *